United States Patent [19]
Tada et al.

[11] 4,388,571
[45] Jun. 14, 1983

[54] CONTROL CIRCUIT FOR AUTOMOBILE ELECTRO-MAGNETIC DRIVING EQUIPMENT

[75] Inventors: Yoshiharu Tada; Yuichi Kitano, both of Higashimatsuyama, Japan

[73] Assignee: Diesel Kiki Kabushiki Kaisha, Tokyo, Japan

[21] Appl. No.: 335,158

[22] Filed: Dec. 28, 1981

[30] Foreign Application Priority Data

Apr. 13, 1981 [JP] Japan .................................. 56-55398

[51] Int. Cl.³ .............................................. G05B 9/02
[52] U.S. Cl. .............................. 318/293; 318/DIG. 1; 318/563; 318/138
[58] Field of Search ........................ 318/641, 285–286, 318/293–294, DIG. 1, 504, 138, 563, 139, 345 R, 345 C

[56] References Cited

U.S. PATENT DOCUMENTS

| | | | |
|---|---|---|---|
| 3,809,981 | 5/1974 | Maida | 318/294 |
| 4,070,610 | 1/1978 | Rudich, Jr. | 318/641 |
| 4,275,340 | 6/1981 | Schleupen | 318/293 |

Primary Examiner—B. Dobeck
Assistant Examiner—A. Evans
Attorney, Agent, or Firm—McAulay, Fields, Fisher, Goldstein & Nissen

[57] ABSTRACT

This invention relates to a control circuit for a motor for use in driving an electrically controlled door such as an air mixing door, inner and outer surrounding air ventilation door, and mode change-over door etc. or an electro-magnetic solenoid for operating an injection pump applied in a Diesel engine or another motor for use in opening or closing a window pane etc. and protects the transistors forming the control circuit.

5 Claims, 4 Drawing Figures

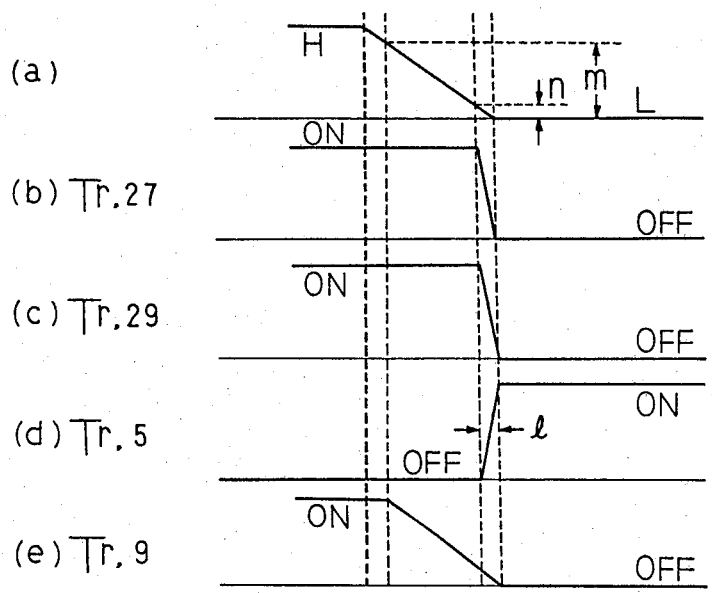

CONTROL CIRCUIT FOR AUTOMOBILE ELECTRO-MAGNETIC DRIVING EQUIPMENT

BACKGROUND OF THE INVENTION

It is well known in the art that a degree of opening of an air flow rate control door such as an air mixing door for use in adjusting a mixing ratio between a cold air cooled by an evaporator and a warm air heated by a heater core in an automobile air conditioning device is controlled in general by DC motor, and said motor is controlled by a control circuit including a calculation circuit for use in comparing and calculating a position signal transmitted from a position sensor circuit for said door and a target signal transmitted from a temperature setting device. As this control circuit, it has been proposed to provide a control circuit composed of a switching transistor shown, for example, in FIG. 1. In FIG. 1, reference 1 indicates a calculation amplifier in which a target signal $V_H$ is fed to a reverse input and a position signal $V_{IN}$ transmitted from a sensor circuit 3 for use in sensing a position of the air flow rate control door 2 is fed to a non-reverse input terminal via resistor 1a. The calculation amplifier 1 operates as a comparator, and its output terminal is connected to a base of PNP transistor 5 via resistor 4 and connected to a base of NPN transistor 9 via resistor 7 and diode 8. To the reverse input of the calculation amplifier 10 applied as a comparator is fed said position signal $V_{IN}$ via resistor 10a, and to the non-reverse input is fed a target signal $V_L$. Output terminal of the calculation amplifier is connected to a base of PNP transistor 12 via resistor 11 and further connected to a base of NPN transistor 16 via resistor 14 and diode 15. Between the base and emitter of said transistor 5 is connected a resistor 17, and an emitter of said transistor is connected to a power supply, its collector is connected to a collector of the transistor 9, and further a collector of the transistor 5 is connected to a motor 18. Between a base and an emitter of said transistor 12 is connected a resistor 19, an emitter of said transistor is connected to the power supply, its collector is connected to a collector of the transistor 16, the collector is connected to another terminal of the motor 18. Between the base of the transistor 9 and an earth is connected a resistor 20, an emitter of the transistor 9 is connected to the earth. Between a base of the transistor 16 and the earth is also connected a resistor 21, and its emitter is connected to the earth. In this case, said target signal $V_H$ is set higher than the target signal $V_L$. The motor 18 is applied to control a degree of opening of the door 2, for example, such as an air mixing door, and the position signal $V_{IN}$ for indicating a degree of opening of the door 2 is transmitted to each of the calculation amplifiers 1 and 10 by the opening degree sensor circuit 3 as the door 2 is controlled.

With the arrangement above, its operation will be described as follows. In case of $V_{IN} > V_H$, an output from the calculation amplifier 1 becomes H-level, an output from the calculation amplifier 10 becomes L-level, thereby the transistors 12 and 9 are set ON and the remaining transistors are set OFF, so that an electric current a is flowed to the earth from the power supply via transistor 12, motor 18 and transistor 9, resulting in driving the motor. In turn, in case of $V_L < V_{IN} < V_H$, since an output from the calculation amplifier 1 becomes L level, an output from the calculation amplifier 10 becomes L level, both transistors 5 and 12 are set ON and both transistors 9 and 16 are set OFF, resulting in that said electric current a flowed in the motor 18 is shut off and the motor 18 is then stopped. In case of $V_{IN} < V_L$, the output from the calculation amplifier 1 becomes L level and the output from the calculation amplifier 10 becomes H level, so that both transistors 5, 16 are set ON, and the remaining transistors are set OFF, an electric current flowing in a direction opposite to that described above is flowed in the motor 18 and then the motor 18 is rotated in a reverse direction. Thus, the motor 18 is automatically controlled in such a manner as the position signal $V_{IN}$ is always set between the target signals $V_H$ and $V_L$, and a position of the door 2 may be adjusted by providing a relative variation between the values of target signals $V_H$ and $V_L$.

However, a conventional type of the control circuit for automobile electro-magnetic driving device shows that, as shown in FIG. 2, if an output from the calculation amplifier 1 is set at H level as shown in FIG. 2(a) before the time $T_1$, the transistor 9 is also set ON as shown in FIG. 2(c) along with the transistor 12. From the time $T_1$, an output from the calculation amplifier 1 begins to reverse to L level with a specified delay in response, then the transistor 9 is changed from its ON condition to its OFF condition as shown in FIG. 2(c), and the transistor 5 is also changed from its OFF condition to ON condition as shown in FIG. 2(b) substantially in synchroneous with the condition of the transistor 5.

Therefore, when the transistor 9 is set OFF, the transistor 5 is set ON, and at this time since a response speed i.e. a reversing speed of both transistors 5, 9 is low, resulting in producing a space S in which both transistors are set ON and during this time the electric current is flowed from the power supply to the earth via transistors 5, 9 to produce their short circuited condition. And further when a chattering operation is occurred at a time of reversing of the calculation amplifier 1, an apparent response of the amplifier is delayed and then said short circuited condition may be occurred. Therefore, a high electric current is flowed at the transistors 5 and 9, resulting in reducing a life of the elements. This condition may also be found in the transistors 12 and 16. Thus, it may also be assumed to connect a resistor 23 to a line 22 arranged between the emitters of the transistors 9, 16 and the earth so as to restrict the high electric current caused by said short circuited condition. However, in this case, a variation in voltage of power supply caused by a voltage drop across the resistor 23 is produced and a rotational speed of the motor is reduced. And with the control circuit composed of the elements described above, a similar problem in operation will be occurred when a battery damp serge 24 is flowed from the power supply for example when transistors 5, 6 are set OFF, transistors 9, 12 are set ON, respectively. That is, a voltage applied to the calculation amplifier 1 is usually restricted to such a value as being lower than a voltage of power supply under an influence of a protective resistor and capacitor connected to the calculation amplifier. Due to this fact, a value of voltage with H level transmitted from the output terminal of the calculation amplifier 1 becomes lower than the level of voltage at power supply. Since an emitter potential of the transistor 5 becomes lower than the base potential due to a presence of said battery damp serge 24, a conventional type of the control circuit shows such disadvantages as the transistor 5 is set ON and a short circuited current is flowed from the transistor 5 to the transistor 9 and both transistors are damaged thereby.

SUMMARY OF THE INVENTION

It is a major object of the present invention to prevent a short circuited condition and protect transistors by a method wherein reverse timing operations between the first and second transistors and the third and fourth transistors connected in series with each other are not overlapped.

It is another object of the present invention to restrict a variation of a voltage of power supply by a method wherein a resistor restricting a short circuited current is not connected.

It is yet another object of the present invention to prevent a short circuited condition by a method wherein the first and third transistors are forcedly kept OFF and are not set ON when the second and fourth transistors are set ON even if a battery dump serge is flowed from the power supply or even if a chattering is occurred when the calculation amplifier is reversed.

It is still further object of the present invention to provide an accurate control over an air flow rate control door for an automobile air conditioning device by a method wherein in case that an electro-magnetic driving equipment for vehicle is a motor, a braking operation is applied so as to reduce a reverse electro-motive force under a stopped condition of said motor, the motor is prevented from being rotated past its stopping position with its inertia.

BRIEF DESCRIPTION OF THE DRAWINGS

Other objects, features and advantages of the present invention will become apparent from the following detailed description in reference to the accompanying drawings, wherein;

FIG. 4(a) is a graph for showing a variation of output from the calculation amplifier 1.

FIGS. 4(b), (c), (d) and (e) are a graph for showing an operation of the transistors 27, 29, 5 and 9, respectively.

DETAILED DESCRIPTION OF THE INVENTION AND PREFERRED EMBODIMENTS

Figure 1:
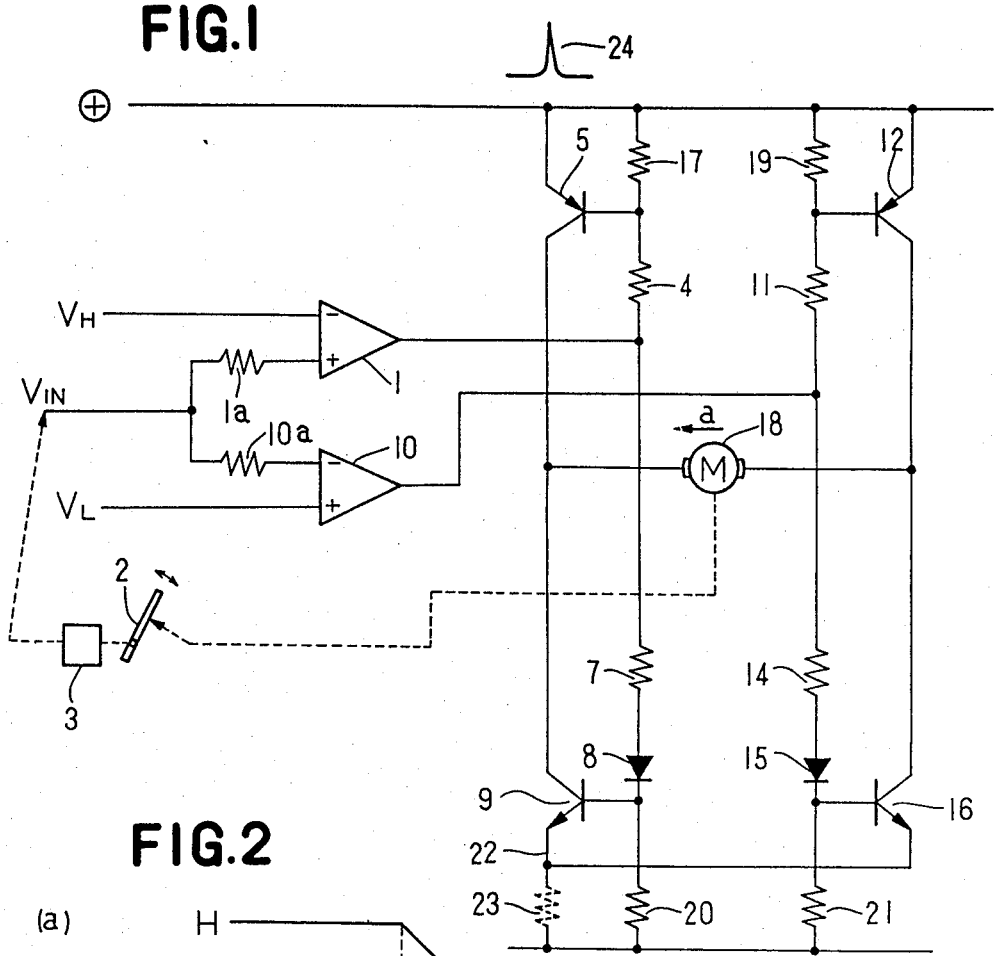
FIG. 1 shows a circuit diagram for illustrating one example of a control circuit for a conventional type of an electro-magnetic driving equipment.
Figure 2:
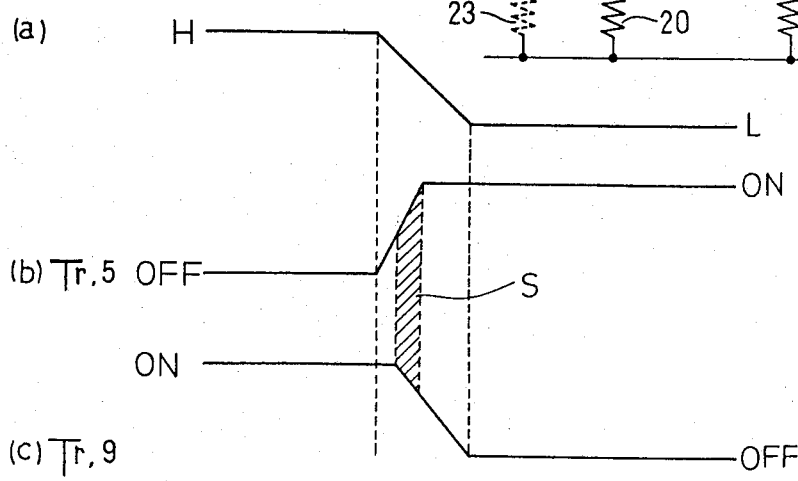
FIG. 2(a) is a graph for showing a variation of output from a calculation amplifier 1.
FIG. 2(b) shows an operation of the transistor 5.
FIG. 2(c) shows an operation of the transistor 9.
Figure 3:
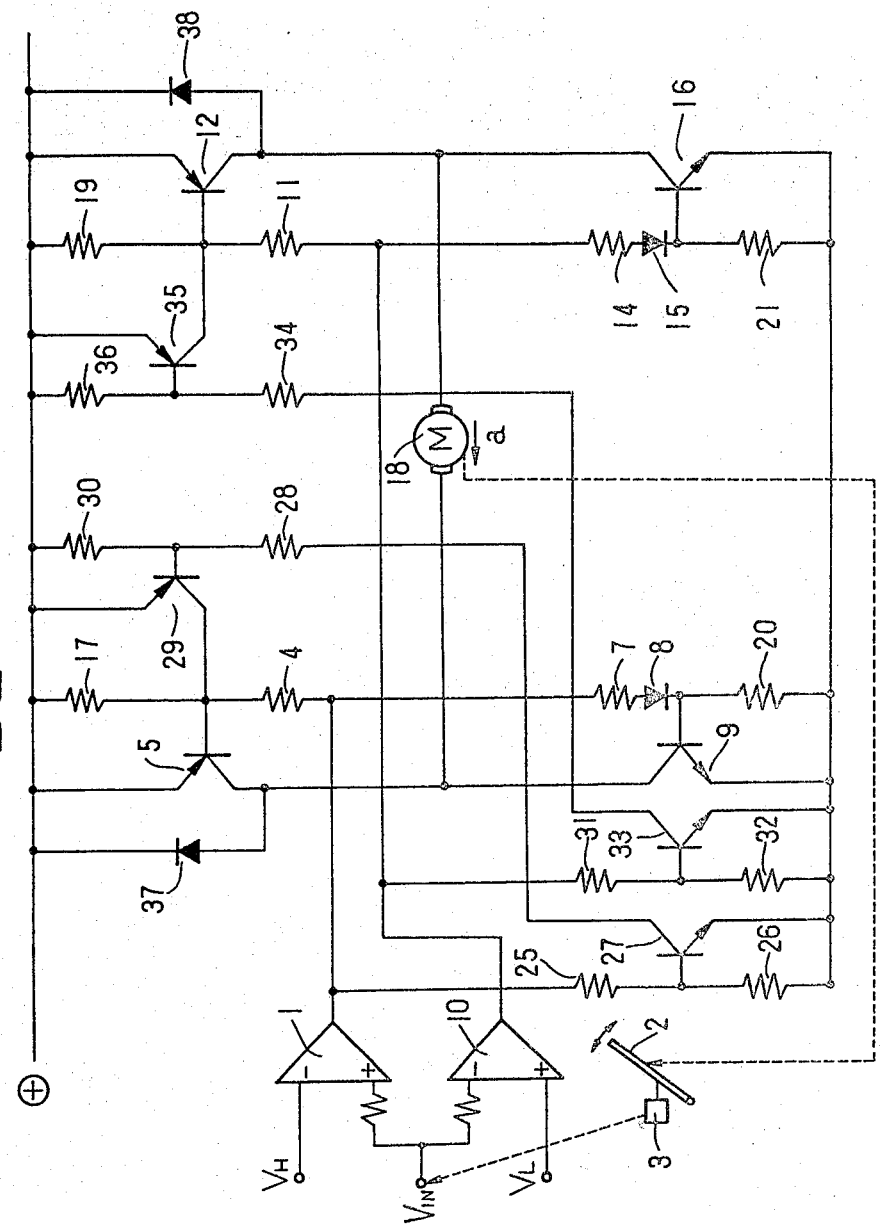
FIG. 3 is a circuit diagram for illustrating one preferred embodiment of a control circuit for an electro-magnetic driving equipment for vehicle constructed in accordance with the present invention.

In FIG. 3, an output from the calculation amplifier 1 is connected to an earth via resistors 25, 26. A junction point between said resistors 25 and 26 is connected to a base of NPN transistor 27, an emitter of the transistor 27 is connected to an earth, its collector is connected to a base of PNP transistor 29 via resistor 28, an emitter of PNP transistor 29 is connected to the power supply, its collector is connected to a base of the transistor 5, and a resistor 30 is connected between the base and emitter of the transistor 29. An output from the calculation amplifier 10 is connected to an earth via resistors 31 and 32, a junction point between the resistors 31 and 32 is connected to a base of the transistor 33, a collector of the transistor 33 is connected to a base of PNP transistor 35 via resistor 34. Between the base of said transistor 35 and the power supply is connected a resistor 36, an emitter of said transistor 35 is connected to the power supply and its collector is connected to a base of a transistor 12. Collector of the transistor 5 is connected to the power supply via diode 37, a collector of the transistor 12 is also connected to the power supply via diode 38, these diodes 37 and 38 being operated to absorb the reverse electro-motive voltage produced in the motor 18.

With the arrangement above, the transistor 27 operates to control the transistor 29, the transistor 5 is controlled in response to an operation of the transistor 29, the transistor 33 controls the transistor 35 and then the transistor 12 is controlled in reference to the operation of the transistor 35. That is, in case of $V_{IN} > V_H$, the output from the calculation amplifier 1 becomes H level and the output from the calculation amplifier 10 becomes L level. Therefore, the transistor 9 is set ON, the transistor 12 is also set ON, and an electric calculation amplifier 10 becomes L level. Therefore, the transistor 9 is set ON, the transistor 12 is also set ON, and an electric current is flowed in the motor 18 in a direction indicated by arrow a. Since the transistor 27 is set ON and the transistor 29 is also set ON under H level output from the calculation amplifier 1, the resistor 17 is kept at a short circuited condition and the transistor 5 is kept OFF. In case of $V_L < V_{IN} < V_H$, the output from the calculation amplifier 1 becomes L level and the output from the calculation amplifier 10 becomes L level, so that only the transistor 5 and the transistor 12 becomes ON, and in turn the transistors 9 and 16 become OFF, resulting in that the electric current flowed in the motor 18 in a direction indicated by arrow a is shut off. At this time, the motor 18 generates a reverse electro-motive voltage due to its inertia, and the electric current is flowed in a direction opposite to that of a due to a presence of the electro-motive voltage. However, this electric current is short circuited via diode 38, a bus line connected to the power supply, transistor 5 and the motor 18, so that a braking operation may be applied to the motor 18. To the contrary, in case of $V_{IN} < V_L$, the output from the calculation amplifier 1 becomes L level and the output from the calculation amplifier 10 becomes H level, so that the transistors 5 and 16 are set ON and an electric current is flowed in a direction opposite to that indicated by arrow a. During this time, the transistor 33 is set ON, thereby the resistor 19 is kept in a short circuited condition, so that the transistor 12 may be kept OFF. Then, in case of $V_L < V_{IN} < V_H$, both outputs from the calculation amplifiers 1 and 10 become L level, so that an electric current flowed in the motor 18 may be shut off, an electric current produced by the electro-motive voltage during this time may be short circuited by an electric current flowed through the diode 37, resulting in enabling an application of the braking force against the motor.

Referring now to FIG. 4, a condition in which the output from the calculation amplifier 1 is reversed from H level to L level will be described. As illustrated in FIG. 4(a), an output voltage from the calculation amplifier 1 is gradually decreased from time $T_1$ to time $T_2$ due to a delay in response. And when the output from the calculation amplifier 1 is gradually decreased from H level toward L level down to a level m, a base potential of the transistor 9 is decreased and as shown in FIG. 4(e) the transistor 9 begins to reverse in a direction for OFF condition. In this case, a base potential of the transistor 27 is also decreased, but under this low base potential, the transistor 29 is kept ON as shown in FIG. 4(b) due to on-condition of the transistor 27 in view of the fact that the values of resistors 25 and 26 are already set to cause the transistor 27 to keep its on-condition as indicated in FIG. 4(b), then the resistor 17 is short circuited due to on-condition of the transistor 29, resulting in that the transistor 5 is forcedly kept locked at its OFF condition as shown in FIG. 4(d) even if the transistor 9 begins to reverse its condition. That is, when the output from the calculation amplifier 1 is slightly decreased from H level down to the level m, the transistor 9 is reversed in a direction of OFF and during this operation the transistor 5 is kept locked. Since the values of resistors 25 and 26 are already set in such a way as the transistor 27 is set OFF as shown in FIG. 4(b), when the output from the calculation amplifier 1 is further decreased down to the level n lower than said level m, the transistor 29 is set OFF and the transistor 5 is set ON in reference to the above. However, a rapid reverse operation is made for the transistor 5, and the transistor 9 almost shows OFF condition during a reverse interval 1, so that the reversing operations of both transistors 5 and 9 are hardly overlapped with each other, and so a short circuited electric current is not flowed from the power supply to the earth via both transistors 5 and 9. The above-mentioned operation may similarly be performed even if the output from the calculation amplifier 10 is reversed from H level to L level, the transistors 12 and 16 may be prevented from being overlapped for their reversing operation by the transistors 33 and 35 and so a positive prevention of the short-circuited condition may be assured. When the output from the calculation amplifier 1 is at H level and the output from the calculation amplifier 10 is at L level under a relation of $V_{IN} > V_H$ and a battery damp serge (a high voltage generated in several 100 ms) is applied from the power supply, the transistor 29 is kept ON due to ON condition of the transistor 27 even if a level from the calculation amplifier 1 is lower than the voltage level of the power supply, thereby the transistor 5 is forcedly kept ON, a chattering at the reversing of the calculating amplifier 1 or a battery damp serge may not cause the transistor 5 to be turned ON, no short-circuited currents are flowed via transistors 5 and 9, so it may be possible to protect the transistors 5 and 9. In turn, when an output from the calculation amplifier 1 is at L level and an output from the calculation amplifier 10 is at H level to cause a battery damp serge to be applied under a relation of $V_{IN} < V_L$, the transistor 12 is already kept OFF by the transistors 33 and 35, so that the transistor 12 is turned ON and no short-circuited current is flowed. Therefore, it is possible to provide a positive prevention of a short-circuited condition caused by the battery damp serge.

The control circuit constructed in accordance with the present invention has already been described in reference to the case in which the motor 18 is controlled, but it is to be understood that the same principle may be applied not only to the motor but also to another type of electro-magnetic driving equipment such as an electro-magnetic solenoid for an injection pump etc. in which both normal and reverse electric currents may be flowed therein.

The present invention provides a control circuit which is constructed such that an electro-magnetic driving equipment is connected between the junction points of the third and fourth transistors forming a series circuit in the same manner as the junction points between the first and second transistors forming a series circuit, both normal and reverse electric currents are flowed in said electro-magnetic driving equipment by turning on only said first and fourth transistors or only the second and third transistors so as to perform a control operation there is provided a short-circuit prevention transistor for use in controlling said first and third transistors, a reverse operation in direction of off for the second or fourth transistor is sufficiently performed by the short-circuit prevention transistor, thereafter the first and third transistors are reversed in their on direction. With this arrangement, since both the first and second transistors are not turned on simultaneously or the third and fourth transistors are not turned on simultaneously, both the battery and the transistors may be protected, and further it is not necessary to add a restricting resistor for restricting short circuited current, resulting in that a disadvantage of a reduced speed of the electro-magnetic driving equipment such as motor etc. may be overcome. Battery dump serge applied from the power supply may prevent the transistor controlling said electro-magnetic driving equipment from being short circuited, then its reliability may be improved.

What is claimed is:

1. Control circuit for automobile electro-magnetic driving equipment comprising in combination of a first transistor connected to a power supply, a second transistor connected to an earth and connected in series to said first transistor, a third transistor connected to the power supply, a fourth transistor connected to the earth and connected in series to said third transistor, an automobile electro-magnetic driving equipment connected between a common junction point of said first and second transistors and a common junction point of said third and fourth transistors, a first control circuit for transmitting either a high level or low level output to each of the bases of said first and second transistors, turning on either one of the first and second transistors and turning off the other thereof, and a second control circuit for transmitting either a high level or low level output to each of the bases of said third and fourth transistors, turning on either one of the third and fourth transistors and turning off the other thereof wherein both normal and reverse electric currents are fed to said automobile electro-magnetic driving equipment by turning on the first transistor or the fourth transistor or by turning on the second transistor and the third transistor in reference to the outputs from said first and second control circuits characterized in that the same is provided with a first short-circuited prevention transistor in which said first transistor is held off when said second transistor is kept on and the first transistor is reversed from its off condition to its on condition by making a delay of a specified period from the reversing time when the second transistor is reversed from its on condition to its off condition, and a second short-circuit prevention transistor in which said third transistor is held off when the fourth transistor is kept on and the third transistor is reversed from its on condition to its off condition by making a delay of a specified period from the reversing time when the fourth transistor is reversed from its on condition to its off condition.

2. Control circuit for automobile electro-magnetic driving equipment as set forth in claim 1 in which the second and fourth transistors are turned on in reference to the high level outputs from the first and second control circuits, the first and second short circuit prevention transistors are turned on by accepting the high level outputs from the first and second control circuits to keep the first and third transistors in off condition.

3. Control circuit for automobile electro-magnetic driving equipment as set forth in claim 1 in which the second and fourth transistors are reversed to off condition at such a voltage level as the outputs from the first and second control circuits are slightly decreased from their high level to their low level, and the first and second short-circuit prevention transistors are operated at a voltage level lower than said voltage level for reversing the second and fourth transistors to off condition to cause said first and third transistors to be reversed from their off condition to on condition.

4. Control circuit for automobile electro-magnetic driving equipment as set forth in claim 1 in which the first and third transistors are of PNP transistors, the second and fourth transistors are of NPN transistor, and an electric current flowed in an automobile electro-magnetic driving equipment is interrupted by a method wherein said first and third transistors are turned off and the second and fourth transistors are turned on in reference to the low level outputs from both the first and second control circuits.

5. Control circuit for automobile electro-magnetic driving equipment comprising in combination of a first transistor connected to a power supply, a second transistor connected to an earth and connected in series to said first transistor, a third transistor connected to the power supply, a fourth transistor connected to the earth and connected in series to said third transistor, an automobile electro-magnetic driving equipment connected between a common junction point of said first and second transistors and a common junction point of said third and fourth transistors, a first control circuit for transmitting either a high level or low level output to each of the bases of said first and second transistors, turning on either one of the first and second transistors and turning off the other thereof, and a second control circuit for transmitting either a high level or a low level output to each of the bases of said third and fourth transistors, turning on either one of the third and fourth transistors and turning off the other thereof wherein both normal and reverse electric currents are fed to said automobile electro-magnetic driving equipment by turning on the first transistor or the fourth transistor or by turning on the second transistor and the third transistor in reference to the outputs from said first and second control circuits characterized in that the same is provided with a first short-circuit prevention transistor in which said first transistor is held off when said second transistor is kept on and the first transistor is reversed from its off condition to its on condition by making a delay of a specified period from the reversing time when the second transistor is reversed from its on condition to its off condition, and a second short-circuit prevention transistor in which said third transistor is held off when the fourth transistor is kept on and the third transistor is reversed from its on condition to its off condition by making a delay of a specified period from the reversing time when the fourth transistor is reversed from its on condition to its off condition, and a diode for eliminating a reverse electro-motive force generated in an automobile electro-magnetic driving equipment is connected between an emitter of the first transistor and a collector of the third transistor.

* * * * *

UNITED STATES PATENT AND TRADEMARK OFFICE
CERTIFICATE OF CORRECTION

PATENT NO. : 4,388,571
DATED : June 14, 1983
INVENTOR(S) : Yoshiharu TADA, et al.

It is certified that error appears in the above-identified patent and that said Letters Patent are hereby corrected as shown below:

```
Column 1, line 62, "a" should be --a (in italics)--;
Column 2, line 1,  "a" should be --a (in italics)--;
Column 4, line 25, "a" should be --a (in italics)--;
Column 4, line 35, "a" should be --a (in italics)--;
Column 4, line 38, "a" should be --a (in italics)--;
Column 4, line 48, "a" should be --a (in italics)--;
Column 4, line 66, "m" should be --m (in italics)--;
Column 5, line 13, "m" should be --m (in italics)--;
Column 5, line 19, "m" should be --m (in italics)--;
Column 5, line 19, "n" should be --n (in italics)--;
Column 5, line 24, "1" should be --1 (in italics)--;
Column 6, line 22, "Battery dump" should be
        --Battery damp-- .
```

Signed and Sealed this

Twenty-sixth Day of March 1985

[SEAL]

Attest:

DONALD J. QUIGG

Attesting Officer

Acting Commissioner of Patents and Trademarks